(12) United States Patent
Mueller et al.

(10) Patent No.: US 9,851,395 B2
(45) Date of Patent: Dec. 26, 2017

(54) METHOD AND DEVICE FOR CHECKING THE OPERATION OF A PHOTOVOLTAIC MODULE

(71) Applicant: ADENSIS GMBH, Dresden (DE)

(72) Inventors: Tim Mueller, Ottendorf-Okrilla (DE); Bernhard Beck, Volkach Ot Dimbach (DE)

(73) Assignee: Adensis GmbH, Dresden (DE)

( * ) Notice: Subject to any disclaimer, the term of this patent is extended or adjusted under 35 U.S.C. 154(b) by 523 days.

(21) Appl. No.: 14/143,199

(22) Filed: Dec. 30, 2013

(65) Prior Publication Data

US 2014/0111240 A1   Apr. 24, 2014

Related U.S. Application Data

(63) Continuation of application No. PCT/EP2012/002644, filed on Jun. 22, 2012.

(30) Foreign Application Priority Data

Jun. 28, 2011 (DE) .................. 10 2011 105 869

(51) Int. Cl.
  *G01R 31/26* (2014.01)
  *H02S 50/10* (2014.01)
(52) U.S. Cl.
  CPC ......... *G01R 31/2605* (2013.01); *H02S 50/10* (2014.12); *Y10S 901/44* (2013.01)
(58) Field of Classification Search
  CPC .... G01R 31/2605; H02S 50/10; Y10S 901/44
  See application file for complete search history.

(56) References Cited

U.S. PATENT DOCUMENTS 5,164,673 A * 11/1992 Rosener ............ G01R 29/12
  324/452
5,315,232 A * 5/1994 Stewart ............. G01R 29/12
  324/457

(Continued)

FOREIGN PATENT DOCUMENTS

DE           19701152 A1   7/1998
DE       202011003211 U1   6/2011

(Continued)

OTHER PUBLICATIONS

International Search Report of PCT/EP2012/002644, dated Oct. 8, 2012.

*Primary Examiner* — David M Gray
*Assistant Examiner* — Michael Harrison
(74) *Attorney, Agent, or Firm* — Muncy, Geissler, Olds & Lowe, P.C.

(57) ABSTRACT

A method for checking the operation of a photovoltaic module of a photovoltaic power station. The module has a positive terminal, a negative terminal and a number of solar cells, in particular thin-layer solar cells. An electric field emitted by the photovoltaic module as a result of solar radiation is measured at an exposed measurement location during the operation of the power station and the electrical voltage present between the positive terminal and the negative terminal is determined from the measured electric field. A corresponding measuring instrument has a sensor to be placed near the photovoltaic module so as to measure the electric field strength. A rod or wand may be used to position the sensor, or a robot may be configured for automatic travel on the photovoltaic module.

15 Claims, 1 Drawing Sheet

(56) References Cited

U.S. PATENT DOCUMENTS

| | | | |
|---|---|---|---|
| 6,515,215 B1* | 2/2003 | Mimura | H01L 31/044 136/244 |
| 2002/0039030 A1* | 4/2002 | Khazei | G01R 29/0871 324/754.29 |
| 2003/0059966 A1 | 3/2003 | Ellison | |
| 2003/0071628 A1 | 4/2003 | Zank et al. | |
| 2007/0029999 A1* | 2/2007 | Middelhoek | G01R 33/075 324/251 |
| 2009/0229842 A1* | 9/2009 | Gray | H01M 2/1055 173/20 |
| 2010/0301991 A1 | 12/2010 | Sella et al. | |
| 2012/0176103 A1 | 7/2012 | Lizarazo et al. | |

FOREIGN PATENT DOCUMENTS

| | | |
|---|---|---|
| JP | 2004207408 A | 7/2004 |
| WO | 2010139364 A1 | 12/2010 |
| WO | 2011019936 A1 | 2/2011 |
| WO | 2011029018 A2 | 3/2011 |

\* cited by examiner

METHOD AND DEVICE FOR CHECKING THE OPERATION OF A PHOTOVOLTAIC MODULE

CROSS-REFERENCE TO RELATED APPLICATION

This application is a continuation, under 35 U.S.C. §120, of copending international application No. PCT/EP2012/002644, filed Jun. 22, 2012, which designated the United States; this application also claims the priority, under 35 U.S.C. §119, of German patent application No. DE 10 2011 105 869.2, filed Jun. 28, 2011; the prior applications are herewith incorporated by reference in their entirety.

BACKGROUND OF THE INVENTION

Field of the Invention

The invention relates to a method for checking the operation of a photovoltaic module of a photovoltaic power station. The photovoltaic module has a positive terminal, a negative terminal and a number of solar cells, in particular thin-layer solar cells. Furthermore, the invention relates to an associated measuring instrument.

Photovoltaic power stations generate an electrical current from solar radiation. For this, the photovoltaic power station generally has a number of photovoltaic modules, which each comprise a number of solar cells operating in a conventional manner. In the event of a certain degree of solar radiation, a characteristic electrical voltage is present at each of the solar cells depending on the materials from which the solar cells are made and depending on the combination of these materials. In order to achieve a predetermined electrical voltage and power by means of one of the photovoltaic modules, the solar cells of this photovoltaic module are interconnected in series and/or in parallel in a certain way. The photovoltaic modules in turn are electrically connected to one another in such a way that the photovoltaic power station has a certain output voltage.

The photovoltaic modules and the solar cells contained therein exhibit aging phenomena. These aging phenomena, also referred to as degradation, result in a reduction in the efficiency. In general, the efficiency declines by between 10% and 20% within 20 years owing to a change in the material within the solar cells. Furthermore, total failure of individual photovoltaic modules occasionally takes place. Preferably, defective or prematurely degraded photovoltaic modules would need to be replaced in order to maintain the power of the power station. In order to determine whether or not any such photovoltaic modules are present, the photovoltaic modules need to be checked for their operation. Generally, in order to check the operation of the photovoltaic modules, the photovoltaic modules need to be detached individually from the combined structure and checked separately, wherein said photovoltaic modules are connected to conventional current and/or voltage measuring instruments.

In the case of solar radiation on the photovoltaic power station, however, the electrical voltage, which can generally reach up to 1000V, is present at the electrical connections between the individual photovoltaic modules. In the event of disconnection of the connections, therefore, arcs can occur which damage the photovoltaic modules or other components of the photovoltaic power station or could injure or kill any person performing this activity. In addition, when disconnecting the electrical connections between the individual photovoltaic modules, the current flow through said photovoltaic modules is interrupted, with the result that no electrical current is produced or the supply is at least restricted during the checking of the power station. In any case, the photovoltaic module to be checked is not available for power generation. Therefore, it is generally uneconomical to perform a check on the operation of the photovoltaic modules of the photovoltaic power station, with the result that defective modules are not identified and replaced, which results in a reduced output of the power station.

International patent application publication WO 2010/139364 A1 describes, for monitoring a photovoltaic system comprising a plurality of photovoltaic modules, assigning a measurement system to said photovoltaic modules for the module-specific detection of the current intensity and the voltage in each case, i.e. in module-linked fashion, in order to thereby identify faulty operation and to localize such instances of faulty operation in the photovoltaic system. The large number of required measurement systems results in an undesirably high degree of complexity, however. In addition, only the measurement of the total voltage of the respective module, but not a voltage measurement at different cells (module or solar cells) of a photovoltaic module which conventionally has a plurality of cells is possible by means of the known device.

German utility model (Gebrauchsmuster) DE 20 2011 003 211 U1 describes a measuring arrangement for a photovoltaic system. The photovoltaic system comprises a photovoltaic module, which is connected to an inverter via a first energy transmission path. The inverter is connected to an electrical grid via a second energy transmission path. A sensor which is a current or voltage sensor is arranged in each energy transmission path. The inverter is monitored by means of the two sensors.

U.S. Pat. No. 6,515,215 B1 describes a photovoltaic system and a method for detecting faulty photovoltaic modules. For this purpose, the photovoltaic module has, in addition to solar cells, discrimination means which are connected in parallel or in series with a photovoltaic cell. The discrimination means have signal means, by means of which a signal is generated. The signals means emit light, for example, or generate a magnetic or electric field. In the case of the electric field, the signal means is a capacitor, whose surface charge is determined.

SUMMARY OF THE INVENTION

It is accordingly an object of the invention to provide a method and device for checking the functionality of a photovoltaic module which overcome the above-mentioned disadvantages of the heretofore-known devices and methods of this general type and which provides for an improved check on the operation of a photovoltaic module of a photovoltaic power station.

With the foregoing and other objects in view there is provided, in accordance with the invention, a method of checking the operation of a photovoltaic module of a photovoltaic power station, the photovoltaic module having a positive terminal, a negative terminal and a number of solar cells; when solar radiation is incident on the photovoltaic module, an electrical voltage is generated between the positive and negative terminals and an electrical current flows via the terminals; and the electrical voltage causes an electric field with a given electric field strength to be emitted by the photovoltaic module into a surrounding environment thereof;

the novel method comprises the following steps:

during an operation of the power station, measuring the electric field strength of the electric field generated as a result of the solar radiation at a given measurement location outside the photovoltaic module; and determining the electrical voltage present between the positive terminal and the negative terminal of the photovoltaic module from the measured electric field strength.

The method is used for checking the operation and serviceability of a photovoltaic module of a photovoltaic power station. The term "photovoltaic power station" is generally understood to mean any combination of photovoltaic modules for generating electrical current, wherein the electrical interconnection of the photovoltaic modules within the photovoltaic power station is in parallel, in series or a combination of the two. In one extreme case, the photovoltaic power station can also comprise only a single photovoltaic module, however. In particular, a combination of a number of photovoltaic modules on the roof of a building or an outdoor installation in the form of a so-called solar park is referred to as a photovoltaic power station.

The, or each, photovoltaic module of the power station has a positive terminal and a negative terminal, which are each electrically connected to at least one, but preferably to a plurality of solar cells. The solar cells are in particular so-called thin-layer solar cells. The connection of the solar cells within the photovoltaic module is in parallel, in series or a combination of the two. When solar radiation is incident on the photovoltaic module, an electrical voltage and an electrical current which flows via the two terminals is generated by means of the photovoltaic module between the two terminals. As a result of the electrical voltage, an electric field is emitted by the photovoltaic module into the surrounding environment thereof.

At (at least) one exposed measurement location outside the photovoltaic module, in accordance with the method the electric field or the electric field strength is now measured. An "exposed" measurement location is in this case understood to mean a measurement location whose relative position with respect to the photovoltaic module is predetermined for the implementation of the method or is fixed according to predetermined criteria during the method. "Outside" is in this case in particular understood to mean that the measurement location is not confined to the module or that the measurement (measured value pickup) of the electric field strength is not linked to a module.

According to the method, provision can additionally be made for a number of measured values to be picked up, for example, at different measurement locations. The electrical voltage present between the two terminals is determined by means of the measured value(s). This is performed, for example, by means of a comparison of the measured values with one or more reference values.

During the measurement of the electric field or the electric field strength, contact is not made with any current-conducting material of the photovoltaic module. The measurement of the voltage therefore takes place both indirectly and in contactless fashion. In order to check the operation of the photovoltaic module, no current-conducting electrical connections need to be detached and reconnected. During the operation check, owing to the fact that the power station continues to be in operation, the way in which said power station operates is not impaired or at least is only impaired to a comparatively low extent.

In accordance with the invention, the measurement location is located outside the photovoltaic module. Thus, the measurement can be performed at a large number of photovoltaic modules and in this case using only one measuring instrument in a manner which is not confined to a module, and this measuring instrument is moved from module to module for this purpose. In addition, it is possible to perform the check on the operation in the case of an already existing photovoltaic module. The electric field strength at different module or solar cells can also be measured, which increases the measurement accuracy of the overall measurement. Expediently, in this case a position corresponding to the greatest electric field or the greatest electric field strength is selected as the measurement location. In other words, the exposed measurement location is preferably that location outside the photovoltaic module at which the absolute value of the electric field generated by said photovoltaic module or the electric field strength assumes its maximum value.

The location corresponding to the field maximum can be determined in advance prior to the actual implementation of the method and predetermined as the measurement location. Thus, given a known configuration of the photovoltaic module, the electric field can be calculated theoretically and the location associated with the field maximum can be determined. Alternatively, this location can be determined on a measurement station by means of a comparable photovoltaic module. By virtue of the fact that the measurement location, in relation to the respective photovoltaic module, is predetermined, the measurement can take place without delay at this location. It is likewise conceivable for the measurement of the electric field to take place at a location at which the value of the electric field (field strength) assumes a certain fraction at the position corresponding to the greatest electric field strength. For example, the maximum of the absolute value of the electric field outside the photovoltaic module can be determined by means of dividing the measured value by this fraction.

If the configuration of the photovoltaic module is unknown, the electric field (field strength) along the surface of the photovoltaic module is measured, and this location is determined by means of comparison of the individual respective measured values. Thus, the operation check can also be performed in the case of an already existing photovoltaic module with an unknown configuration.

Suitably, in addition to the electrical voltage present between the negative terminal and the positive terminal, the electrical current flowing through the photovoltaic module, which is at least partially generated by said photovoltaic module, is determined. For this, the magnetic field resulting from the electrical current is measured and the electrical current is calculated from the measured value by means of a formula. In particular, in the case of a known configuration, i.e. a known interconnection of the solar cells within the solar module, the electrical current is determined from a single measured value. Suitably, the measured value is multiplied by a calibration factor, which has been determined, for example, on a test station or theoretically, and is conditioned such that multiplication of the measured value by this calibration factor gives the electrical current. The calibration factor can also vary depending on certain parameters, such as, for example, the distance between the measurement and the photovoltaic module and/or the solar radiation. Corresponding values for the calibration factor can be stored in a family of characteristics.

That is the measurement of the magnetic field could be performed by means of a magnetic field sensor which is enclosed within the photovoltaic module and in particular is cast therein. During the production of the photovoltaic module, in this case the magnetic field sensor would be installed, for example, fixedly within the photovoltaic module or in a subsequent step fitted onto the photovoltaic module in a fixed location. Preferably, the magnetic field is picked up at the exposed measurement location at which the electric field (field strength) is also measured. In particular, a measuring instrument comprising a sensor for measuring the electric field and comprising a further sensor for measuring the magnetic field is provided for this purpose. Alternatively, the measuring instrument, purely for measurement purposes, can be brought into a certain position with respect to the photovoltaic module and then removed again. In this way, it is possible to check a large number of photovoltaic modules for their respective proper operation by means of only one measuring instrument, wherein this can take place in a comparatively time-saving manner at a single location owing to the measurement of both the electrical and the magnetic fields.

In a preferred embodiment of the invention, however, the magnetic field surrounding a conductor, which is connected either to the negative terminal or the positive terminal of the photovoltaic module and through which the electrical current likewise flows, is measured. In this case, the measurement is preferably only performed in a plane which runs perpendicular to the direction of the electrical current. A measurement of the magnetic field in this location is comparatively simple owing to the normally limited physical extent of the conductor in this plane. In this case, for example, the magnetic field is measured along a closed curve, which is within this plane, and added up.

In a particularly suitable embodiment, so-called calipers are used. Since generally a plurality of photovoltaic modules are interconnected in series to form a so-called string, this method is particularly advantageous, especially since, in accordance with Kirchhoff's Laws, the current needs to be measured only at one point for the entire string. With the aid of the Biot-Savart Law or Ampere's Law, the electrical current can likewise be calculated by means of these measured values.

If the position corresponding to the greatest electric field outside the photovoltaic module is selected as the measurement location and the configuration of the photovoltaic module is not known, expediently the surface of the photovoltaic module is traversed by means of the preferably mobile measuring instrument and the electric field (field strength) is measured continuously or at fixed measurement increments. In the case of a measurement of the magnetic field, it is possible to record the curve integral of the magnetic field along a curve, substantially at least in sections. In particular if the photovoltaic module is designed (for example symmetrically) in such a way that the magnetic field of a closed curve around the photovoltaic module can be calculated from at least the recorded measured values, the Biot-Savart Law or Ampere's Law can be used to calculate the electrical current.

Suitably, a power value of the photovoltaic module is set by means of the determined electrical current and the determined electrical voltage. In particular, the power value is the power generated by means of the photovoltaic module and is conventionally calculated as the product of the electrical current and the electrical voltage.

Advantageously, the power value is compared with a set point value for the power of the photovoltaic module, wherein the set point value is dependent on the present solar radiation. For this purpose, expediently, the solar radiation incident on the photovoltaic module is measured by means of a radiation sensor. In this case, the radiation sensor is subject to comparatively little aging or is renewed comparatively often, so that the measured value of the solar radiation substantially corresponds to the actual solar radiation. The radiation sensor is tied, for example, to the sensor for the magnetic field or to the sensor for the electric field. Alternatively, the radiation sensor can also be fitted fixedly to the photovoltaic power station.

If the power value is below the set point value by a certain percentage or a certain absolute value, this is taken as an indication of the photovoltaic module being defective or at least not functioning properly. In particular, in order to ensure efficient operation of the photovoltaic power station, such an identified photovoltaic module is replaced or repaired. A particular advantageous factor with this procedure consists in that power analysis of the photovoltaic module(s) of the photovoltaic power station takes place during operation thereof. In this way, no live plug connections need to be detached and connected to a measuring instrument, with the result that the risk associated therewith to the health of the person performing the task and possible damage to the installation owing to arcs are avoided. Furthermore, the power analysis does not result in any operational failure of the power station.

Particularly advantageously, with the invention such a high increase in the measurement speed and therefore the productivity of the measurement operation is achieved that an extensive and particularly time-saving survey on the photovoltaic module or generator or power station is possible. This in turn means a qualitative improvement in the measurement system or operation.

With the above and other objects in view there is also provided, in accordance with the invention, a measuring instrument for checking the serviceability of a photovoltaic module of a photovoltaic power station, which comprises a positive terminal and a negative terminal. The, preferably mobile, measurement instrument has a sensor for measuring the electric field emitted as a result of solar radiation by the photovoltaic module or the electric field strength. By means of the electrical sensor, the electric field (field strength) emitted by the photovoltaic module is measured at an exposed measurement location. The measuring instrument furthermore comprises a unit which is designed to calculate the electrical voltage present at the photovoltaic module between the positive terminal and the negative terminal from the measured electric field or from the measured electric field strength.

In a preferred embodiment, the measuring instrument has a conventional electric field mill as the electric sensor for measuring the electric field. The field mill comprises a rotating flywheel, which is connected to ground and which subjects a measuring electrode, which is connected electrically to ground via an ammeter, periodically to the influence of the electric field (field strength) and shields said measuring electrode from said field. The electric field (field strength) induces electrical charges on the measuring electrode which flow away via the measuring instrument during the shielding phase. This current is measured by means of the measuring instrument and, from this, the strength of the electric field (field strength) is determined.

Preferably, the measuring instrument additionally comprises a sensor for measuring the magnetic field, which is generated owing to the electrical current flowing through the photovoltaic module. The magnetic field sensor comprises in particular a Hall sensor. The sensor is particularly advantageously fitted or positioned fixed in location at the same time on a string line throughout the measurement of the electric field (E field measurement).

The sensors for measuring the electric field or the magnetic field (B field measurement) can also be positioned in a fixed location relationship with respect to one another, wherein in particular the magnetic field sensor is tied to the sensor for measuring the electric field. However, it is preferred for the magnetic field sensor and the sensor for measuring the electric field to be accommodated in two separate housings and not be in contact with one another.

Expediently, the measuring instrument has a support pole, by means of which at least one of the two sensors is positionable with respect to the photovoltaic. In particular, the sensor for measuring the electric field is brought to the exposed measurement location by means of the support pole. Preferably, the measuring instrument can be carried (by a human) by means of the support pole. Alternatively, however, the measuring instrument can also be fastened on a positioning device, in particular an articulated arm of a mobile crane or an aerial lift device, by means of the support pole. Expediently, the magnetic field which surrounds a conductor connected to one of the two terminals, which conductor conducts the electrical current, is measured. The measurement is performed in particular by means of so-called calipers, which bear the magnetic field sensor.

As an alternative to this, a robot has the measuring instrument. The robot is configured to move the measuring instrument independently along the photovoltaic module, in particular on the surface thereof. In this case, for example, the measuring instrument is fitted on the robot, which moves along a pole, a cable or a guide rail, which are each fitted in particular above the photovoltaic module, or by means of suckers on the surface of the photovoltaic module. Expediently, the magnetic and/or the electric field is/are measured during the movement of the robot or the location of the exposed measurement location which is driven by the robot substantially without delay for checking the operation of the photovoltaic module is stored in the robot. Alternatively, the magnetic field sensor can also be located in the calipers, by means of which the magnetic field is measured at a fixed location on the conductor. In this case, only the sensor for measuring the electric field is taken along the photovoltaic module by means of the robot.

Other features which are considered as characteristic for the invention are set forth in the appended claims.

Although the invention is illustrated and described herein as embodied in a method and device for checking the operation of a photovoltaic module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

Mutually corresponding and functionally equivalent parts have been provided with the same reference symbols in all of the figures.

DETAILED DESCRIPTION OF THE INVENTION

Figure 1:
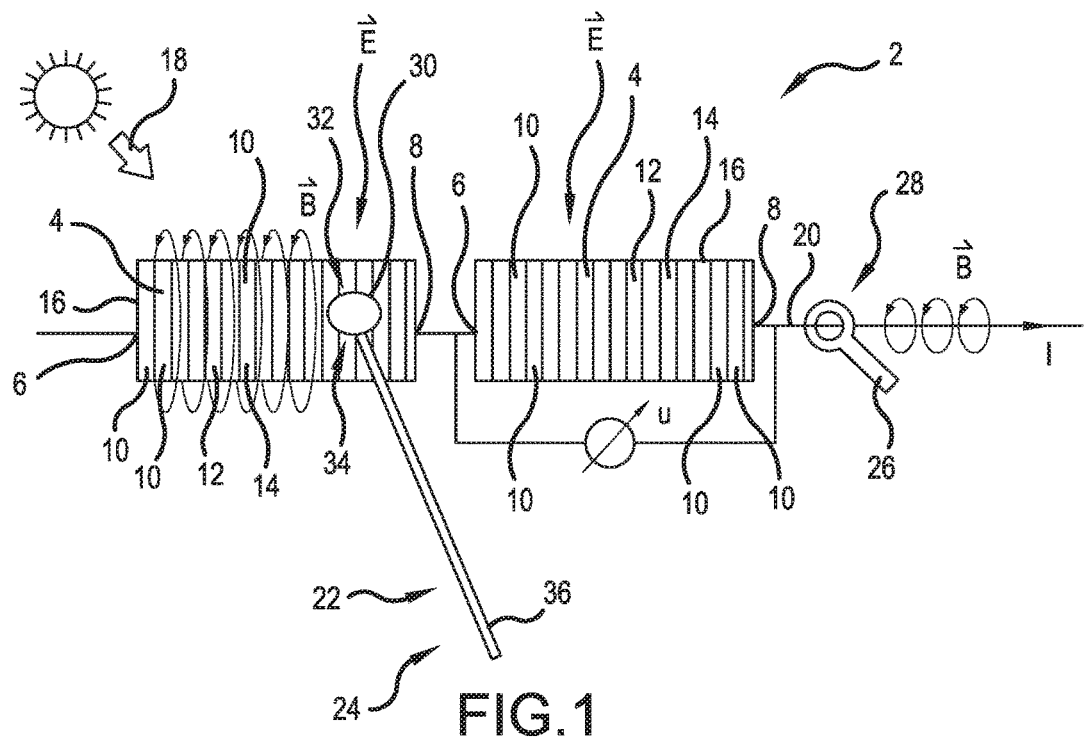
FIG. 1 shows a schematic view of a portable measuring instrument with a support pole.

Referring now to the figures of the drawing in detail and first, particularly, to FIG. 1 thereof, there is shown a schematic illustration of a photovoltaic power station 2 comprising two substantially identical photovoltaic modules 4. Each of the photovoltaic modules 4 has a positive terminal 6 and a negative terminal 8. In this case, the positive terminal 6 of one of the photovoltaic modules 4 is electrically connected to the negative terminal 8 of the other photovoltaic module 4. The photovoltaic power station 2 therefore has a series configuration in this case, i.e. the photovoltaic modules 4 are connected to one another in series.

Each of the photovoltaic modules 4 has a plurality of solar cells 10, which are fitted on a rear wall 12, for example. The solar cells 10 are preferably thin-layer solar cells. In order to protect against damage to the solar cells 10, said solar cells are covered over their entire area by a pane of glass 14, which substantially has the same dimensions as the rear wall 12. In this case, the pane of glass 14 rests flush on the rear wall 12, and the edges of the stack thus formed are covered by means of a peripheral frame 16, for example consisting of aluminum, and are therefore protected against any damage. It would likewise be conceivable for the solar cells 10 or at least some thereof to be vapor-deposited directly onto the pane of glass 14 and/or for at least one of the photovoltaic modules 4 to comprise only a single solar cell 10. The solar cells 10 of each of the photovoltaic modules 4 are connected in series or parallel with one another. One of the solar cells 10 of one of the photovoltaic modules 4 is electrically connected to the positive terminal 6 of said photovoltaic module and a further one of the solar cells 10 is electrically connected to the negative terminal 8 of said photovoltaic module 4.

On the incidence of solar radiation 18, an electrical voltage U is set between the positive terminal 6 and the negative terminal 8 of a photovoltaic module 4 by means of the solar cells 10 and an electrical current I flows. The electrical voltage U generates an electric field E, which surrounds the photovoltaic module 4. The electrical current I brings about a magnetic field B, which surrounds the solar cells 10. Since the electrical current I flows through an electrical conductor (line) 20, which is connected to one of the terminals 6, 8 of one of the two photovoltaic modules 4, the magnetic field B likewise forms around said conductor.

By means of a measuring instrument 22, which is in the form of a portable measuring instrument 24, i.e. not a fixed measuring instrument, by way of example, here, the electric field E and the magnetic field B are measured. For this, the measuring instrument 22 comprises conventional calipers 26 with a Hall sensor 28. The calipers 26 surround the conductor 20 and detect the magnetic field B surrounding the conductor 20. With the aid of the Biot-Savart Law or Ampere's Law, the electrical current I flowing through the conductor 20 is determined from the detected value. In this case, the current I which is flowing through the conductor 20, owing to the series circuit is equal to the current I which is flowing through the individual photovoltaic modules 4.

The measuring instrument 22 has an electric field mill 30, by means of which the electric field E is measured at an exposed measurement location 32. A position 34 with respect to the photovoltaic module 4 at which the electric field surrounding this photovoltaic module 4 or the electric field strength E has the greatest value is selected as the measurement location 32. Since the electric field or the electric field strength E decreases as the distance from the photovoltaic module 4 whose electrical voltage U generates the electric field E decreases, the position 34 is located on the surface of this photovoltaic module 4. The field mill 30 is moved towards the position 34 by way of a support pole 36, or rod or wand. In a known arrangement of the solar cells 10 within this photovoltaic module 4 and therefore a known propagation form of the electric field E, it is possible to move the field mill 30 directly towards the position 34. If this should not be the case, given a substantially constant amount of incident solar radiation 18, the field mill 30 can be brought over the surface of the photovoltaic module 4 by the support pole 36 and the electric field or the electric field strength E can be measured using the field mill 30 until the position 34 has been determined on the basis of the recorded measurement data.

The electrical voltage U is calculated from the value for the electric field or for the electric field strength E at the position 34, wherein the functional relationship between the electric field (field strength) E at the position 34 and the electrical voltage U present between the two terminals 6, 8 has been determined, for example, on a test station. In particular, the functional relationship is Coulomb's Law, and any coefficients specific of the photovoltaic module 4 are detected on the test station.

The value of the determined electrical current I is multiplied by the value for the determined electrical voltage U and therefore determines a power value for this photovoltaic module 4. This power value is compared with a set point value of the power of the photovoltaic module 4, wherein the solar radiation 18 is taken into consideration. In the case of a relatively low amount of incident solar radiation 18, the set point value is lower than in the case of a comparatively high amount. If the power value of the photovoltaic module 4 is comparatively far below the setpoint value, this photovoltaic module 4 of the photovoltaic power station 2 is replaced.

The calculation of the power value is performed for all of the photovoltaic modules 4 of the photovoltaic power station 2. In this case, in each case the electric field E of each photovoltaic module 4 is measured (E field measurement) and the electrical voltage U which is present at each of the photovoltaic modules 4 is determined. Since the electrical current I is constant, given a constant amount of incident solar radiation 18 and given the series circuit of photovoltaic modules 4, only a single measurement of the magnetic field B (B field measurement) and a single determination of the electrical current I are necessary.

In practice, at the same time the magnetic field B is preferably measured with each E field measurement within or with respect to a string, but always at the same measurement location around a conductor of this string.

Figure 2:
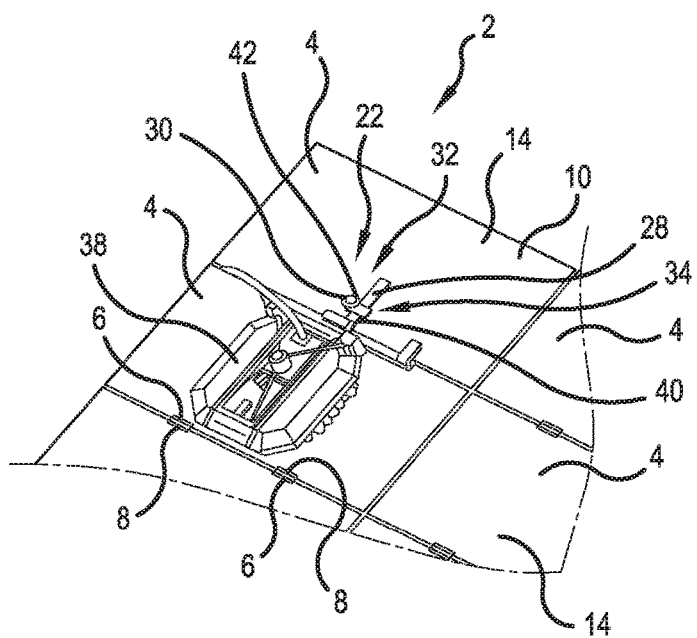
FIG. 2 shows a perspective view of a robot with a measuring instrument.

Referring now to FIG. 2, there is shown a perspective view of a robot 38 with the measuring instrument 22. The robot 38 moves automatically in the manner of a cat burglar robot over the photovoltaic modules 4 of the photovoltaic power station 2. For example, the robot 38 is held by means of suckers on the photovoltaic modules 4 or moves along poles, cables or guide rails.

The photovoltaic power station 2 is in this case in the form of a so-called outdoor solar power station. In contrast to the photovoltaic modules 4 illustrated in FIG. 1, these photovoltaic modules 4 do not have any frames.

By means of a positioning unit 40, the robot 38 moves the measuring instrument 22 over one of the photovoltaic modules 4, which is adjacent to the photovoltaic module 4 on which the robot 38 is located at that time and performs the operation check on this photovoltaic module. Therefore, the photovoltaic module 4 to be checked is only covered by the comparatively small measuring instrument 22, which means that the power of the photovoltaic module 4 is impaired to a comparatively small extent. The measuring instrument 22 is moved towards the position 34 with respect to the photovoltaic module 4 to be checked and in particular is positioned on the photovoltaic module 4 in order to ensure a defined measurement height. In this way, the measured value recorded by means of the measuring instrument 22 is not influenced owing to a change in position of the measuring instrument 22 with respect to the photovoltaic module 4 during the measurement, as is caused, for example, by gusts of wind which can cause the positioning unit 40 to oscillate.

By means of the measuring instrument 22, both the magnetic field B and the electric field (field strength) E are measured at the position 34 and, from these values, the electrical current I and the electrical voltage U are determined with the aid of a family of characteristics or a functional relationship explained above in connection with FIG. 1. In addition, during the movement of the measuring instrument 22 towards the position 34 by means of the positioning unit 40 and/or during the movement of the robot 38, the magnetic field B and/or the electric field E can be measured. In this way, more accurate values for the electrical current I or the electrical voltage U can be calculated. In a comparable manner to the measuring instrument 22 shown in FIG. 1, the measurement of the electrical current I can be performed using the calipers 26 in this case, too. Then, it is merely necessary to move the field mill 30 over the photovoltaic module 4 by means of the positioning unit 40.

In turn, the power value corresponding to the incident solar radiation 18 is calculated from the values for the electrical current I and the electrical voltage U in accordance with the relationship $P=U \times I$ and compared with the associated set point value. The incident solar radiation 18 is detected by way of a radiation sensor 42, which is fitted on the measuring instrument 22. The radiation sensor 42 can likewise also be installed fixedly on the photovoltaic power station 2.

The invention claimed is:

1. A method of checking the operation of a photovoltaic module of a photo-voltaic power station, the photo-voltaic power station includes a plurality of photovoltaic modules each photovoltaic module having a positive terminal, a negative terminal and a number of solar cells, wherein, when solar radiation is incident on the photovoltaic modules, an electrical voltage is generated between the positive and negative terminals and an electrical current flows via the terminals and the electrical voltage causes an electric field with a given electric field strength to be emitted by the photovoltaic modules into a surrounding environment thereof, the method comprising the following steps:

during an operation of the power station, measuring the electric field strength of the electric field generated as a result of the solar radiation at a given measurement location outside at least one of the photovoltaic modules using a movable measuring instrument, the movable measuring instrument being an electric field mill; and determining the electrical voltage present between the positive terminal and the negative terminal of the at least one photovoltaic module from the measured electric field strength.

2. The method according to claim 1, which comprises selecting the given measurement location at a position corresponding to a greatest electric field strength.

3. The method according to claim 1, which comprises measuring a magnetic field generated by the photovoltaic module and determining the electrical current flowing through the photovoltaic module from the magnetic field.

4. The method according to claim 3, which comprises measuring the magnetic field at the given measurement location.

5. The method according to claim 3, which comprises measuring the magnetic field around an electrical conductor connected to one of the first and second terminals.

6. The method according to claim 1, which comprises ascertaining a power value for the photovoltaic module from a determined electrical current and the determined electrical voltage.

7. The method according to claim 1, wherein said measuring is performed indirectly and contactlessly.

8. A measuring instrument for checking an operation of a photovoltaic module of a photovoltaic power station, the photo-voltaic power station includes a plurality of photovoltaic modules each photovoltaic module having two terminals, the measuring instrument comprising:
   a movable sensor for measuring an electric field strength of an electric field emitted by the photovoltaic module into a surrounding environment thereof owing to an electrical voltage generated between the two terminals when solar radiation is incident on the photovoltaic module; wherein the electric field strength is detected during operation of the power station as a result of the solar radiation at a measurement location outside the photovoltaic module; and
   a unit for calculating the electrical voltage present at the photovoltaic module,
   wherein the movable sensor for measuring the electric field is an electric field mill.

9. The measuring instrument according to claim 8, configured for implementing the method according to claim 1.

10. The measuring instrument according to claim 8, which comprises a magnetic field sensor for measuring a magnetic field.

11. The measuring instrument according to claim 8, comprising a support pole for movably positioning said sensor with respect to the photovoltaic module.

12. A robot, comprising:
    a measuring instrument according to claim 8; and
    a system for automatic travel along a photovoltaic module and for positioning the measuring instrument at a measurement location on the photovoltaic module.

13. The measuring instrument according to claim 8, wherein the movable sensor comprises calipers and a Hall sensor.

14. The measuring instrument according to claim 8, wherein the measuring instrument includes only one movable sensor.

15. A measuring instrument for checking an operation of a photovoltaic module of a photovoltaic power station, the photo-voltaic power station includes a plurality of photovoltaic modules each photovoltaic module having two terminals, the measuring instrument comprising:
    a movable sensor for measuring an electric field strength of an electric field emitted by the photovoltaic module into a surrounding environment thereof owing to an electrical voltage generated between the two terminals when solar radiation is incident on the photovoltaic module; wherein the electric field strength is detected during operation of the power station as a result of the solar radiation at a measurement location outside the photovoltaic module; and
    a unit for calculating the electrical voltage present at the photovoltaic module,
    wherein the movable sensor comprises calipers and a Hall sensor, and
    wherein the movable sensor further comprises an electric field mill.

* * * * *